United States Patent [19]

Starner

[11] Patent Number: 4,516,217
[45] Date of Patent: May 7, 1985

[54] EVENT SELECTOR FOR WIDE RANGE PROBABILITY OF OCCURRENCE

[75] Inventor: Eugene R. Starner, Maple Shade, N.J.

[73] Assignee: RCA Corporation, Princeton, N.J.

[21] Appl. No.: 428,432

[22] Filed: Sep. 29, 1982

[51] Int. Cl.³ .......................................... H03B 29/00
[52] U.S. Cl. ..................................... 364/717; 331/78
[58] Field of Search .......................... 364/717; 331/78

[56] References Cited

U.S. PATENT DOCUMENTS

| | | | |
|---|---|---|---|
| 3,614,399 | 10/1971 | Linz ........................... | 364/717 |
| 3,617,925 | 11/1971 | Bensema et al. ............... | 331/78 |
| 3,913,031 | 10/1975 | Membrino ...................... | 331/78 |
| 4,047,008 | 9/1977 | Perkins ........................ | 364/717 |
| 4,142,240 | 2/1979 | Ward et al. ................... | 364/717 |
| 4,173,000 | 10/1979 | Singer et al. ................. | 331/78 |
| 4,218,749 | 8/1980 | Babaud et al. ................. | 364/717 |
| 4,296,384 | 10/1981 | Mishima ........................ | 331/78 |
| 4,375,620 | 3/1983 | Singer ......................... | 331/78 |

OTHER PUBLICATIONS

Mitchell et al., "Table-Lookup Methods for Generating Arbitrary Random Numbers", *IEEE Trans. on Computers*, vol. C-26, No. 10, Oct. 1977, pp. 1006-1008.

*Primary Examiner*—David H. Malzahn
*Attorney, Agent, or Firm*—Joseph S. Tripoli; Robert L. Troike; William H. Meise

[57] ABSTRACT

An event selector includes a random number generator for randomly generating $2^N$ N bit words, first and second memories each having $2^{N/2}$ storage locations with each storage location containing a predetermined stored word and each responsive to selected N/2 bit portions of each of the $2^N$ N bit words to output the contents of the storage locations accessed by the selected N/2 bit portions, and an output terminal. Also provided in gating logic for gating only the outputted contents of all but X selected storage locations of the first memory to the output terminal and to gate only the outputted contents of the second memory to the output terminals when any of the contents of the X selected storage locations are outputted.

8 Claims, 4 Drawing Figures

EVENT SELECTOR FOR WIDE RANGE PROBABILITY OF OCCURRENCE

The United States Government has rights under this invention pursuant to Government contract N00039-79-C-0088 awarded by the Department of the Navy.

This invention relates generally to noise generators and more particularly, to structure for generating a very large range of noise events using only a small fraction of memory capacity as compared with that required by prior art structures.

During laboratory testing of electronic equipment, it is often desirable to simulate the environment in which the equipment will operate. One such environment for communications equipment is noise and particularly atmospheric noise. Atmospheric noise is impulsive in nature, has a wide dynamic range of amplitudes, and a wide range of probability of occurrence. For example, atmospheric noise typically extends over a dynamic range greater than 80 dB with the lowest amplitude impulses occurring most of the time and the largest amplitude impulses occurring less than perhaps once in every million impulses. Random events such as atmospheric noise can be simulated in the laboratory using electronic linear feedback shift registers (LFSR) which generate a uniform distribution of numbers (i.e., each possible binary number has an equal probability of occurring). However, using an LFSR for atmospheric noise generation (or other randomly occurring events) directly is undesirable since the required register (LFSR) length would need to be 10,000 stages long for an 80 dB dynamic range. Real implementations generally use a D/A converter at the output of the LFSR to shorten the register length to 20 to 40 stages. However, even this would fall short for atmospheric noise since the LFSR generates a uniform distribution of levels and atmospheric noise is not uniformly distributed.

Some prior art devices employ a programmable read only memory (PROM) in conjunction with an LFSR to generate noise events. In order to generate noise events that occur only once in a million impulses, a PROM having a million word locations is required and therefore addressing capability for one million memory locations is also required. Such addressing capability can be accomplished with an LFSR of 20 or more stages. The above structure is required because the LFSR generates all addresses with the same probability, i.e., time equally and the one in a million rare event must be stored in only one memory location of a one million address memory. If the event requires many bits for definition (an atmospheric noise event would require about 13 bits to define a dynamic range of 80 decibels) the PROM capacity would be corresponding larger, perhaps of the order of two megabytes of storage, assuming one memory location in PROM for each address generated by the LFSR.

The present invention achieves the same large dynamic range of 80 decibels and wide range of probabilities of one in a million using only four kilobytes of memory as compared with the two megabytes of memory required by prior art techniques.

In accordance with a preferred form of the invention, there is provided an event selector comprising a random number generator for randomly generating $2^R$ N bit words, first and second memories respectively having $2^P$ and $2^Q$ storage locations, with each storage location containing a predetermined stored word and each storage location responsive to P and Q bit portions of selected ones of the $2^R$ N bit words to output the contents of storage locations accessed by the selected P and Q bit portions, where $P+Q=R \leq N$, an output terminal, and gating logic for gating only those outputted contents of all but X selected storage locations of the first memory to the output terminal and also to gate only the outputted contents of the second memory to the output terminal when any of the contents of the X selected storage locations are outputted from the first memory, and where $X << 2^P$. In a preferred form of the invention $P=Q$ and $P+Q=R=N$ so that $X=2^{N/2}$.

In the drawings

Figures 1, 1A:
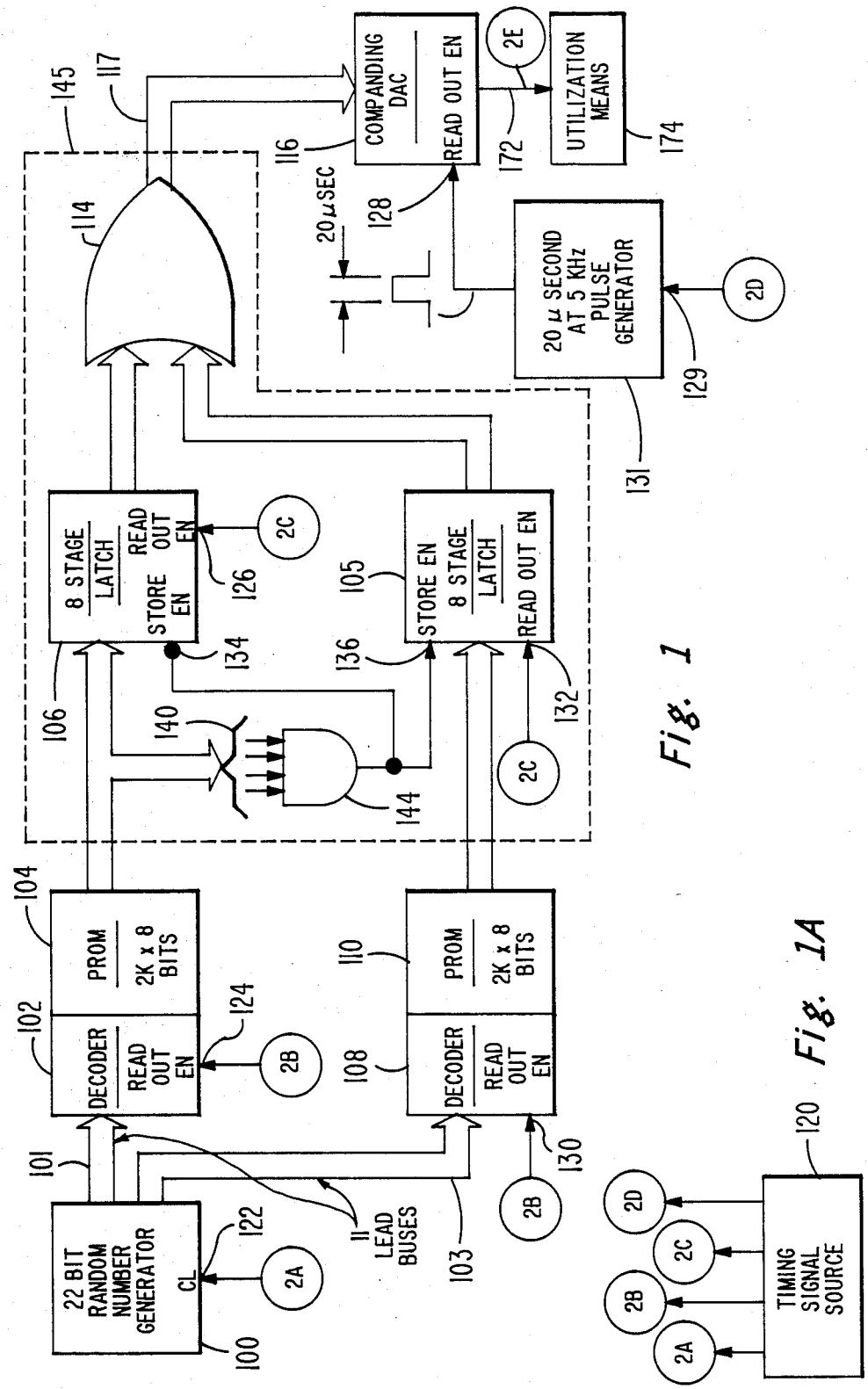
FIG. 1 shows a block diagram of the invention.
FIG. 1a shows a timing signal source.

Referring now to FIG. 1 there is shown a 22 bit random number generator 100 which can be of the type comprising electronic linear feedback shift registers (LFSR) shown and described in more detail on pages 7–19 and 90–108 of a publication entitled "Shift Register Sequences" by Solomon W. Golomb, published by Holden-Day, Inc. 1967, and incorporated herein by reference.

The random number generator 100 is assumed to generate and supply two separate 11 bit address words (where $P=Q$ and $P=Q=N$) from its generated 22 bit random numbers both to decoder 102 and decoder 108 which decodes such 11 bit signals to access memory locations in the PROMS of the 2K (2048) byte PROMS 104 and 110. The contents of the 2,048 word locations of both PROMS 104 and 110 are supplied to the inputs of latches 106 and 105, respectively. However, during the time that the contents of accessed word locations of PROMS 104 and 110 are supplied to their respective latches 106 and 105 only one of such latches will be enabled to store the words supplied thereto.

The foregoing is accomplished by means of AND gate 144 whose output goes to the inhibit input 134 of the store enable terminal of latch 106 and to the store enable input 136 of latch 105. More specifically, for example, when AND gate 144 is enabled, the latch 106 is disabled and therefore unable to store the word supplied thereto from PROM 104 since the high level signal supplied from AND gate 144 to store enable input 134 becomes a low level signal due to the inverter input 134. On the other hand, the latch 105 is enabled because of the high level signal supplied to the store enable input 136 thereof. The AND gate 144, latches 106 and 107, and OR gate 114, all included in block 145, form a multiplexer type switch.

Figure 2:
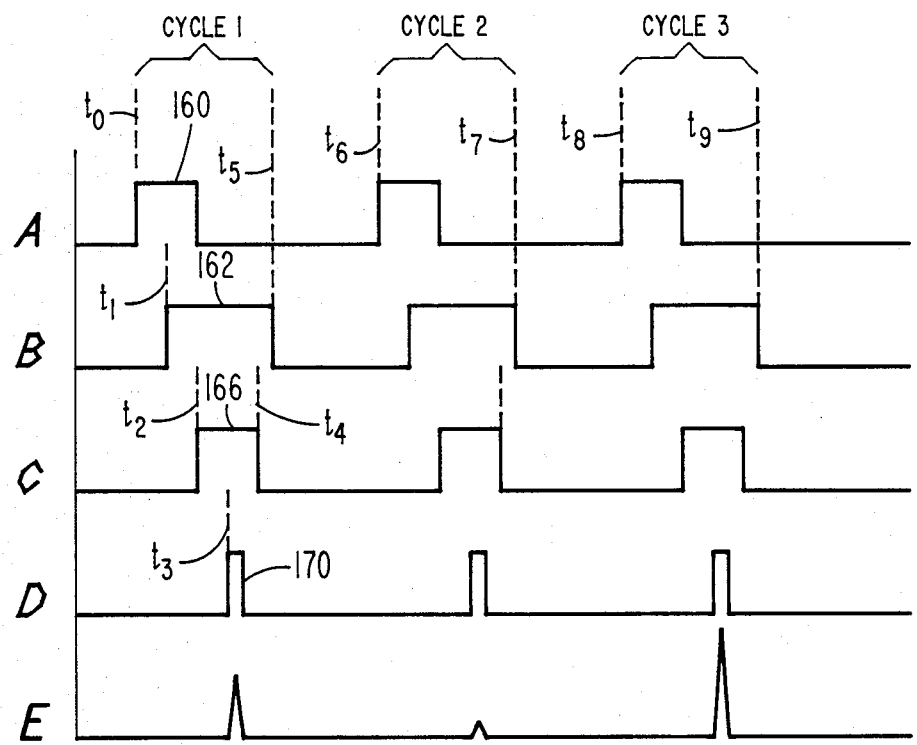
FIG. 2 is a set of timing waveforms to facilitate an understanding of FIG. 1.

The foregoing operation can be seen from an examination of the timing waveforms A, B, C, D of FIG. 2 which, for purposes of brevity, will be referred to herein as waveform 2A or waveform 2B rather than as waveform A of FIG. 2 or waveform B of FIG. 2. The clock signal source 120 of FIG. 1A generates the waveforms of FIG. 2 in a well known manner and will not be described in detail herein.

The signals generated by clock signal source 120 and shown in waveforms 2A–2D are supplied to different components of the block diagram of FIG. 1 and are identified by the same designation as is employed to identify the waveforms of FIG. 2. Thus, the timing waveform 2A is shown as being supplied to clock input 122 of random number generator 100 in FIG. 1.

Returning again to the detailed description of the block diagram of FIG. 1, it can be seen that during the time period 160 beginning at time $t_0$, as shown in waveform 2A, the random number generator 100 is clocked to supply new 11 bit random numbers to decoders 102 and 108 via the 11 lead busses 101 and 103, respectively. During the time period 162 beginning at time $t_1$ in waveform 2B the decoders 102 and 108 respond to the 11 bit random numbers supplied thereto from generator 100 to access corresponding word locations in PROMS 104 and 110. The 11 lead busses 101 and 103 are each capable of accessing any one of the $2^{11} = 2048$ word storage locations of PROMS 104 and 110.

During time interval 162 of waveform 2B one or the other of latches 106 and 105 will be enabled to store the words supplied from their respective PROMS 104 and 110 and the other latch will be disabled due to the output of AND gate 144, as described generally above.

Assume that only one of the 2,048 storage locations of PROM 104 contains a word which will enable AND gate 144 and that the contents of all the remaining storage locations of PROM 104 will not enable AND gate 144. Thus, except for such one word, AND gate 144 will be disabled and latch 106 will be enabled to store the contents of the word supplied from PROM 104. The latch 105 will be disabled because of the low level input supplied to its store enable input 136 from AND gate 144.

However, when the one particular storage location in PROM 104 containing the word which will enable AND gate 144 is accessed, the output of AND gate 144 will be at a high level, thereby disabling latch 106 and enabling latch 105. Thus the contents of such particular storage location accessed by the 11 bit address supplied to decoder 108 via bus 103 will be stored in latch 105 and subsequently read out through OR gate 114 to DAC 116 upon the occurrence of a pulse such as pulse 166 beginning at time $t_2$ in waveform 2C.

Any one of the 2,048 storage locations of PROM 110 can be accessed at this time depending upon the random address supplied thereto from generator 100. It is apparent that the probability of any particular address in PROM 110 being selected is one in $2^{22}$ or one in 4,194,304 since the chance of the particular address occurring which enables that particular word location in PROM 104 whose contents enable AND gate 144 is one in $2^{11}$ and the selection of any particular predetermined word location in PROM 110 is also one in $2^{11}$.

It is to be noted that the timing pulse 166 falls entirely within the beginning and ending of the timing pulse 162 of waveform 2B thereby eliminating any race conditions that might otherwise exist between latches 106 and 105 with respect to their storing words supplied thereto from their respective PROMS 104 and 110.

Beginning at time $t_3$ a timing pulse 170, as shown in waveform 2D is supplied to the input of 20 microsecond pulse generator 131, the output of which in turn is supplied to the read-out enable input 128 of DAC 116. The DAC 116 is a companding type DAC which is energized by the narrow 20 microsecond pulse to more closely simulate the narrow pulses occurring in atmospheric noise. The companding feature of the DAC 116 permits the larger dynamic range of the output pulses to even more closely simulate the range of amplitudes found in atmospheric noise.

A companding (compressing/expanding) D/A converter is a special purpose D/A converter which produces analog output voltages proportional to the analog of the input digital word. Unlike a conventional D/A converter which produces a constant voltage increment for each increment in the digital input, the companding D/A produces ever increasing voltage steps for each increment in the digital input. A typical device is Precision Monolithic's DAC-76 which uses 8 bits of digital input but supplies the equivalent of 12 bits of dynamic range on the analog output. This device is more fully explained in the manufacturer's product catalog. For example, see Precision Monolithics, 1981, Full Line Catalog, pages 11-65 to 11-81. The DAC-76 described in the manual produces an output step size of approximately 0.3 dB for each digital level, and the 256 possible digital inputs produce a 72 dB dynamic range output.

Figure 3:
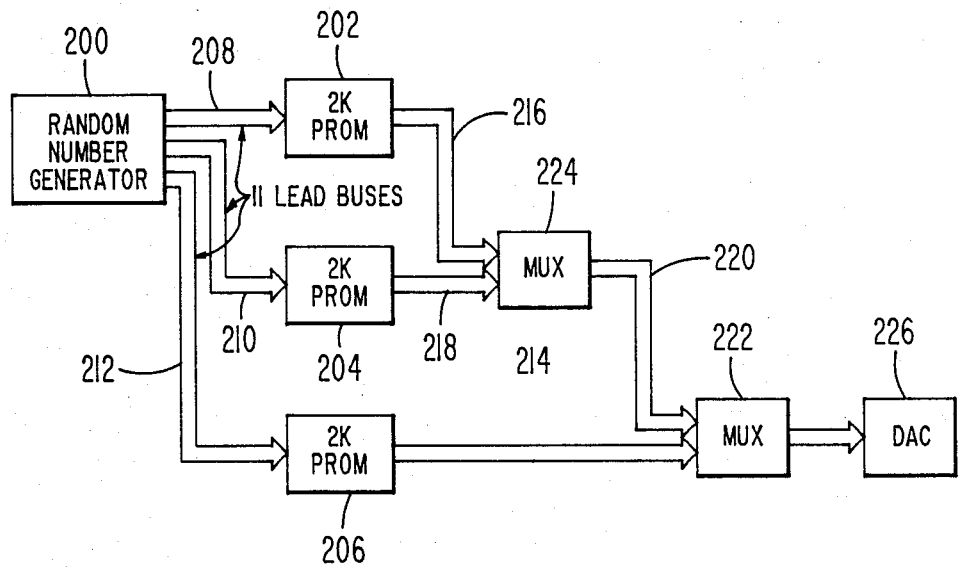
FIG. 3 shows a block diagram of a generalized form of the invention.

The inventive concept shown in FIGS. 1 and 2 can also be expanded into a structure employing more than two PROMS, as shown in FIG. 3. In FIG. 3 the three PROMS 202, 204 and 206 are each supplied with a different 11 bit random signal from random number generator 200 which generates random signals 33 bits in length each of which is supplied as three separate 11 bit random addresses to the three PROMS 202, 204, and 206 via the three 11 lead busses 208, 210 and 212.

The multiplexer (MUX) 224 performs the same function as MUX 145 of FIG. 1 to supply the contents of any given storage location of PROM 204 to the output bus 220 of MUX 224 on the average of once every 4 million times. The MUX 222 functions to respond to the contents of a predetermined storage location of PROM 204 to supply the contents of the particular storage location of PROM 206 being accessed at that time to DAC 226. Thus, the probability of the contents of any given word location of PROM 206 being supplied to DAC 226 is 1 in $2^{33}$ or about 1 in 8.6 billion.

While the bus inputs to the PROMS of FIGS. 1 and 3 are all shown as having the same number of leads, namely 11, it is not necessary that the number of leads be equal. For example, in FIG. 1 the number of leads to decoder 102 could be $P = 10$ and the number of leads to decoder 108 could be $Q = 12$ (where $P + Q = N$) in which case there would be $2^P$ P bit address words for accessing $2^P = 2^{10} = 1024$ number of word locations in PROM 104 and $2^Q$ Q bit address words for accessing $2^Q = 2^{12} = 4096$ word locations in PROM 110. However, the probability of accessing a given word location in PROM 110 would still be one out of $2^N = 2^{22}$ since the total number of leads to decoders 102 and 108 is still 22.

I claim:
1. An event selector comprising:
  a random number generator for randomly generating a first plurality of random number generator addresses, said plurality being equal to the digit two raised to an integer power, said integer being the sum of second and third integers;
  first and second memory logic means each having input and output terminals and further having a second and third plurality of storage locations, respectively, said second plurality being equal to the digit two raised to said second integer power and said third plurality being equal to the digit two raised to said third integer power, with each storage location containing a predetermined stored word and each responsive to selected ones of said addresses to output onto said output terminals the contents of the storage locations accessed by said selected addresses;

first output means;

first gating means for gating only the outputted contents of all but a predetermined number of selected storage locations of said first memory means to said first output means and to gate only the outputted contents of said second memory means to said first output means when any of the contents of said predetermined number of selected storage locations are outputted.

2. An event selector as in claim 1 in which said first memory logic means comprises:

third and fourth memories each having first and second numbers of storage locations, said first number of storage location being equal to the digit two raised to a fourth integer power, said second number of storage locations being equal to the digit two raised to a fifth integer power, with each said storage location containing one of said predetermined words of said first memory logic means and each responsive to a selected one of said addresses to output the contents of the particular storage locations accessed by said selected addresses, where the sum of said fourth and fifth integer equal said second integer; and second gating means for gating all but a sixth integer number of selected storage locations of said third memory to said output terminal of said first memory logic means and to gate only the outputted contents of said fourth memory to said output terminal of said first memory logic means when any of the contents of said sixth integer number of selected storage locations are outputted.

3. An event selector based on the probability of occurrence of an event and comprising:

a random number generator capable of generating at each clock pulse one of a first plurality equal to the digit two raised to a first integer power of first digital words having said first integer number of bits and at each said clock pulse also generating one of a second plurality equal to the digit two raised to a second integer power of second digital words having said second integer number of bits;

first memory logic means having said first plurality of storage locations, and selectively responsive to said first digital words to output the contents of selected ones of said first plurality of storage locations;

second memory logic means having said second plurality of storage locations, and selectively responsive to said second digital words to output the contents of selected ones of said second plurality of storage locations, where the sum of said first and second integers equals a third integer;

utilization means;

gating means for supplying to said utilization means only the contents of all but a predetermined number of selected storage locations of said first memory means when accessed, and to respond to the contents of a given one of said predetermined number of selected storage locations of said first memory means to supply to said utilization means the contents of the storage location of said second memory logic means accessed by that one of said second digital words generated by said random number generator concurrently with that one of said first digital words accessing said given one of said storage locations of said first memory logic means.

4. An event selector comprising:

a random number generator for generating a sequence of digital words selected randomly from among a plurality equal to the digit two raised to a first even integer power of digital words, each of said digital words having said first even integer number of bits;

first and second memory means each having a second plurality equal to the digit two raised to a second integer power of storage locations, said second integer being equal to one-half said first integer, with each said storage location containing a predetermined stored word and responsive to selected portions of each of said digital words having said second integer number of bits to output the contents of storage locations acessed by said selected portions of each of said digital words output means; and gating means for gating to said output means only the outputted contents of all but a preselected number of storage locations of said first memory means and to gate to said output means only the outputted contents of said second memory means when any of the contents of said preselected storage locations are outputted, and where said preselected number is much smaller than said second plurality.

5. The method of generating events representing values based on probability of occurrence of such events comprising the steps of:

generating a series of sets of first and second different simultaneously generated random numbers;

gating the contents of all but a predetermined number of the word locations of a first memory to a first output means;

gating the contents of a simultaneously accessed word location of a second memory to said first output means when the contents of one of said predetermined number of word locations of said first memory is accessed; and accessing the contents of the word locations of first and second memories with said first and second random numbers, respectively, of each set.

6. A method as in claim 5 and comprising the further steps of:

generating a series of third random numbers different from said first and second random numbers, each of said third random numbers being generated simultaneously with one of said sets of first and second random numbers;

gating the contents of all but second predetermined number of the word locations of said first and second memories supplied to said first output means to a second output means;

gating the contents of the simultaneously accessed word location of a third memory to said second output means when the contents of one of said second predetermined number of word locations of said first and second memories is accessed; and accessing the contents of the word locations of said third memory with said third series of random numbers.

7. Apparatus, comprising:

a source of clock signals;

first and second random-number generators coupled to said source of clock signals for generating first and second digital random numbers, respectively, at each clock signal;

first addressable memory means including a first plurality of memory locations and also including addressing means coupled to said first random-number generator for accessing at each said clock signal that one of said first plurality of memory locations selected in response to said first random number for reading the contents of said selected memory locations, each of said memory locations of said first memory means being preprogrammed with one word of a set of first control words and a set of second control words, the proportional number of said second control words relative to the number of said first control words being small;

second addressable memory means including a second plurality of memory locations and also including second addressing means coupled to said second random -number generator for accessing at each said clock signal that one of said second plurality of memory locations selected in response to said second random number for reading the contents of said selected memory locations, each of said memory locations of said second memory means being preprogrammed with one word of a set of third control words and a set of fourth control words, the proportional number of said fourth control words relative to said third control words being small;

utilization means; and controllable multiplexing means coupled to said first and second addressable memory means and to said utilization means for coupling to said utilization means at each said clock signal one of said first, third and fourth control words, said multiplexing means being responsive to said first control words to couple said first control words to said utilization means, and also being responsive to said second control words to decouple said second control words from said utilization means and to couple to said utilization means that one of said third and fourth control words then being read from said second memory means, whereby said fourth control words are coupled to said utilization means with a probability of occurrence which approximates the product of said proportional number of said second control words relative to said first control words multiplied by said proportional number of said fourth control words relative to said third control words.

8. Apparatus according to claim 7 wherein said utilization means comprises a nonlinear processing circuit for generating relatively small - amplitude signals from said first and third control words and relatively large- amplitude signals from said fourth control words.

* * * * *